US009182673B2

(12) United States Patent
Wuister

(10) Patent No.: US 9,182,673 B2
(45) Date of Patent: Nov. 10, 2015

(54) METHOD FOR PROVIDING A TEMPLATE FOR A SELF-ASSEMBLABLE POLYMER FOR USE IN DEVICE LITHOGRAPHY

(75) Inventor: Sander Frederik Wuister, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 120 days.

(21) Appl. No.: 14/131,885

(22) PCT Filed: Jun. 14, 2012

(86) PCT No.: PCT/EP2012/061293
§ 371 (c)(1),
(2), (4) Date: Jan. 9, 2014

(87) PCT Pub. No.: WO2013/010730
PCT Pub. Date: Jan. 24, 2013

(65) Prior Publication Data
US 2014/0116980 A1 May 1, 2014

Related U.S. Application Data

(60) Provisional application No. 61/508,908, filed on Jul. 18, 2011.

(51) Int. Cl.
*G03F 7/00* (2006.01)
*B82Y 40/00* (2011.01)
(Continued)

(52) U.S. Cl.
CPC ............... *G03F 7/2024* (2013.01); *B82Y 10/00* (2013.01); *B82Y 40/00* (2013.01); *G03F 7/0002* (2013.01); *G03F 7/16* (2013.01); *B81C 1/00428* (2013.01)

(58) Field of Classification Search
None
See application file for complete search history.

(56) References Cited

U.S. PATENT DOCUMENTS

2009/0179002 A1  7/2009  Cheng et al.
2011/0147983 A1  6/2011  Cheng et al.
(Continued)

FOREIGN PATENT DOCUMENTS

WO  2011/080016  7/2011
WO  2011/128120  10/2011
WO  2012/084558  6/2012

OTHER PUBLICATIONS

International Search Report mailed Oct. 19, 2012 in corresponding International Patent Application No. PCT/EP2012/061293.
(Continued)

*Primary Examiner* — Anita Alanko
(74) *Attorney, Agent, or Firm* — Pillsbury Winthrop Shaw Pittman LLP

(57) ABSTRACT

Methods are disclosed for depositing a template for directed self-assembly of a self-assemblable block polymer on a surface of a substrate. The method involves providing a chemical epitaxy pattern of alternating first and second regions having differing chemical affinities for first and second blocks of the polymer on the surface by photolithography, and providing spaced graphoepitaxy features on the surface by photolithography. The chemical epitaxy pattern is aligned with and located between pairs of spaced graphoepitaxy features. The spaced graphoepitaxy features and chemical epitaxy pattern are arranged to act together to direct self-assembly of the self-assemblable block copolymer. The resulting template may be used to direct self-assembly of a suitable self-assemblable polymer and the resulting aligned and oriented self-assembled polymer may itself be used as a resist for lithography of the substrate.

18 Claims, 7 Drawing Sheets

(51) Int. Cl.
  *G03F 7/20* (2006.01)
  *G03F 7/16* (2006.01)
  *B82Y 10/00* (2011.01)
  *B81C 1/00* (2006.01)

(56) References Cited

U.S. PATENT DOCUMENTS

2011/0147984 A1* 6/2011 Cheng et al. ............... 264/220
2011/0200795 A1   8/2011 Lammers et al.
2014/0127626 A1* 5/2014 Senzaki et al. ............ 430/281.1
2015/0034594 A1* 2/2015 Singh et al. .................. 216/49

OTHER PUBLICATIONS

Seong-Jun Jeong et al., "Soft Graphoepitaxy of Block Copolymer Assembly with Disposable Photoresist Confinement," Nano Letters, vol. 9, No. 6, pp. 2300-2305 (May 7, 2009).
Karl O. Stuen et al., "Graphoepitaxial assembly of asymmetric ternary blends of block copolymers and homopolymers," Nanotechnology, vol. 21, No. 49, pp. 1-7 (Nov. 11, 2010).
Miri Park et al., "Block Copolymer Lithography: Periodic Arrays of ~$10^{11}$ Holes in 1 Square Centimeter," Science, vol. 276, pp. 1401-1404 (May 30, 1997).

* cited by examiner

METHOD FOR PROVIDING A TEMPLATE FOR A SELF-ASSEMBLABLE POLYMER FOR USE IN DEVICE LITHOGRAPHY

CROSS-REFERENCE TO RELATED APPLICATIONS

This application is the U.S. national phase entry of PCT patent application no. PCT/EP2012/061293, which was filed on Jun. 14, 2012, which claims the benefit of priority of U.S. provisional application No. 61/508,908, which was filed on Jul. 18, 2011 and which is incorporated herein in its entirety by reference.

FIELD

The present invention relates to a method of forming a template for directed self-assembly of a self-assemblable block polymer comprising first and second blocks on a surface of a substrate. The invention relates to formation of a self-assembled polymer layer on such a substrate and a method for device lithography using a layer of self-assembled polymer, such as a block copolymer, deposited and assembled on such a substrate provided with a template for directing self-assembly.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) radiation lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of a surface, for example of an imprint template or of other substrate and a chemical resist may be used to achieve this.

The use of self-assembly of block copolymers (BCPs) has been considered as a potential method for improving the resolution to better values than those obtainable by prior art lithography methods or as an alternative to electron beam lithography for preparation of imprint templates.

Self-assemblable block copolymers are compounds useful in nanofabrication because they may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification of the chemical compositions of the blocks of the copolymer.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each comprising one or more identical monomers, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer (A-B-C) may be useful, as may an alternating or periodic block copolymer (e.g. [-A-B-A-B-A-B-]$_n$ or [-A-B-C-A-B-C]$_m$ where n and m are integers). The blocks are connected to each other by covalent links in a linear or branched fashion (e.g. star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the numbers of phases. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

Suitable block copolymers for use as a self-assemblable polymer include, but are not limited to, poly(styrene-b-methylmethacrylate), poly(styrene-b-2-vinylpyridone), poly (styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes parallel or perpendicular to the substrate and lamellar and cylindrical phases are interesting for lithography applications, as they may form line and spacer patterns and hole arrays, respectively, and may provide good contrast when one of the domain types is subsequently etched.

Two methods used to guide or direct self-assembly of a polymer such as a block copolymer onto a surface are graphoepitaxy and chemical pre-patterning, also called chemical epitaxy. In the graphoepitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

In the chemical pre-patterning method (referred to herein as chemical epitaxy), the self-assembly of block copolymer domains is guided by a chemical pattern (i.e. a chemical template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical pattern comprises a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of pre-patterned features on the substrate (so-called density multiplication). Chemical pre-patterning is not limited to a linear pre-pattern; for instance the pre-pattern may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases, where the different domain types are arranged side-by-side on a surface of a substrate.

SUMMARY

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented parallel to the plane of the surface. Perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between domains of different blocks lying substantially perpendicular to the plane of the surface.

A neutral surface is useful in chemical epitaxy and graphoepitaxy. It may be used on a surface between specific orientation regions of an epitaxy template. For instance in a chemical epitaxy template for aligning a di-block copolymer with A and B blocks, where A is hydrophilic and B is hydrophobic in nature, the chemical pattern may comprise hydrophobic pinning regions with a neutral orientation region between the hydrophobic regions. The B domain may preferentially assemble onto the hydrophobic pinning regions, with several alternating domains of A and B blocks aligned over the neutral region between the specific (pinning) orientation regions of the chemical pre-pattern.

For instance in a graphoepitaxy template for aligning such a di-block copolymer the pattern may comprise hydrophobic resist features with a neutral orientation region between the hydrophobic resist features. The B domain may preferentially assemble alongside the hydrophobic resist features, with several alternating domains of A and B blocks aligned over the neutral orientation region between the specific (pinning) orientation resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to 20 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable polymer may be deposited onto the substrate, onto a graphoepitaxy or chemical epitaxy template as set out above. A suitable method for deposition of the self-assemblable polymer is spin-coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperature up to a few ° C. above or below the order/disorder temperature $T_{OD}$ for the polymer.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare. Other methods of transferring a pattern, known in the art, may be applicable to a pattern formed by self-assembly of a block copolymer.

Graphoepitaxy may provide a high level of pitch multiplication and may provide spatially limited compartments in a template, between spaced graphoepitaxy features. By pitch multiplication it is meant that a plurality of unit cells of the self-assembled polymer may be aligned between each adjacent pair of spaced graphoepitaxy features. The unit cell repeat spacing may be referred to as the pitch. This leads to a benefit that defects arising as a result of imperfect self-assembly in one compartment may not necessarily transfer to neighboring compartments. However, graphoepitaxy may present a problem because self-assembly initiated from a side-wall of a graphoepitaxy feature may yield a high defect level in the self-assembled structure. Additionally or alternative, self-assembly initiated from a side-wall of a graphoepitaxy feature may increase image placement errors relative to the spaced graphoepitaxy features.

Chemical epitaxy can provide good alignment and moderate pitch multiplication, but defects which arise during self-assembly may transfer to neighboring regions. However, image placement is generally more accurate for chemical epitaxy.

It is desirable, for example, to combine graphoepitaxy and chemical epitaxy in a single template arrangement for use in directing self-assembly of a self-assemblable block copolymer so that the combined template may, for example, address one or more problems arising from chemical epitaxy alone or graphoepitaxy alone. In particular, it would be desirable, for example, to combine graphoepitaxy and chemical epitaxy in a single template arrangement where the template is formed using conventional photolithography (such as extreme ultraviolet (EUV) radiation lithography for instance) and using conventional photolithography resists in order to achieve the formation of the template.

It is desirable, for example, to provide a method for providing a combined graphoepitaxy and chemical epitaxy template on a substrate surface, for use in directing self-assembly of a layer of block copolymer for subsequent use as a resist layer suitable for use in device lithography. In particular, it is desirable, for example, to provide a method using photolithography to form the combined template. It is desirable, for example, to provide a template for directing self-assembly of a polymer which addresses or overcomes one or more of the problems in the art, now or hereafter known, for chemical and/or graphoepitaxy templates. It is desirable, for example, to provide a template for directing self-assembly of a polymer which is capable of directing self-assembly to produced a self-assembled polymer layer with low defectivity.

According to an aspect of the invention, there is provided a method of forming a template for directed self-assembly of a self-assemblable block polymer comprising first and second blocks on a surface of a substrate, the method comprising:

providing a chemical epitaxy pattern on the surface by photolithography, the chemical epitaxy pattern comprising alternating first and second regions having differing chemical affinities for the first and second blocks; and providing spaced graphoepitaxy features on the surface by photolithography, the chemical epitaxy pattern aligned with and located between pairs of spaced graphoepitaxy features, wherein the spaced graphoepitaxy features and chemical epitaxy pattern are arranged to act together to direct self-assembly of the self-assemblable block copolymer.

According to an aspect of the invention, there is provided a method of forming a self-assembled layer of a self-assemblable block copolymer on a surface of a substrate, comprising:

providing a template for directed self-assembly of the self-assemblable block copolymer on the substrate by a method described herein;

depositing the self-assemblable polymer layer directly onto the template to provide an interface between the self-assemblable polymer layer and the template; and treating the self-assemblable polymer layer to provide self-assembly into an ordered polymer layer at the interface, directed by the template.

According to an aspect of the invention, there is provided a lithography method for patterning a surface of a substrate by resist etching, wherein the method comprises providing an ordered polymer layer at the surface by a method described herein, wherein the ordered polymer layer is used as a resist layer.

According to an aspect of the invention, there is provided a method for forming a device topography at a surface of a substrate, the method comprising using the self-assembled polymer layer, formed by a method described herein, as a resist layer while etching the substrate to provide the device topography.

The following features are applicable to all the various aspects of the methods where appropriate. When suitable, combinations of the following features may be employed as part of the methods and compositions described herein, for instance as set out in the claims. The methods and compositions described herein are particularly suitable for use in device lithography. For instance one or more of the methods may be used for treatment or formation of a resist layer of self-assembled polymer for use in patterning a device substrate directly or for use in patterning an imprint template for use in imprint lithography.

The self-assemblable block polymer may be a block copolymer as set out hereinbefore comprising at least two different block types which are self-assemblable into an ordered polymer layer having the different block types associated into first and second domain types. The block copolymer may be a di-block copolymer or a tri-block or multi-block copolymer. Alternating or periodic block copolymers may be used as the self-assemblable polymer. Although only two domain types may be mentioned in some of the following aspects and examples, an embodiment of the invention is applicable to self-assemblable polymers with three or more different domain types.

In an embodiment, the self-assemblable block polymer is a block copolymer comprising one or more first blocks of first monomer and one or more second blocks of second monomer.

By chemical affinity, in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components.

Whenever appropriate, the use of the term "comprises" or "comprising" may also be taken to include the meaning "consists of", "consisting of", "consists essentially of" or "consisting essentially of".

In this specification, when reference is made to the thickness of a feature, the thickness is suitably measured by an appropriate means along an axis normal to the substrate surface and passing through the centroid of the feature. Thickness may suitably be measured by a technique such as interferometry or assessed through knowledge of an etch rate.

Wherever mention is made of a "layer" in this specification, the layer referred to is to be taken to be layer of substantially uniform thickness, where present. By "substantially uniform thickness" is meant that the thickness does not vary by more than 10%, desirably not more than 5% of its average value across the layer.

By "bonding" of the neutral orientation layer to a surface it is meant that a bond such as a covalent bond, ionic bond or hydrogen bond is formed between the surface and the neutral orientation layer, i.e. a bond stronger than mere van der Waals attraction. In an embodiment, the bonding is covalent or ionic bonding, more desirably covalent bonding. By "unbonded" is meant that no bonds other than van der Waals bonding are present.

In embodiment, there is provided a method of forming a template for directed self-assembly of a self-assemblable block polymer comprising first and second blocks on a surface of a substrate. The method comprises providing a chemical epitaxy pattern on the surface by photolithography. The chemical epitaxy pattern comprises alternating first and second regions having differing chemical affinities for the first and second blocks of the self-assemblable block copolymer. Spaced graphoepitaxy features are also provided on the surface by photolithography. The chemical epitaxy pattern is aligned with and located between pairs of spaced graphoepitaxy features. The spaced graphoepitaxy features and chemical epitaxy pattern are arranged to act together to direct self-assembly of the self-assemblable block copolymer. The spaced graphoepitaxy features are arranged to act as graphoepitaxy features as set out herein. By "aligned with" it is meant that the spaced graphoepitaxy features for directing graphoepitaxy are positioned relative to the chemical epitaxy pattern so that self-assembly of the self-assemblable block copolymer as directed by the chemical epitaxy pattern and self-assembly as directed by the spaced graphoepitaxy pattern are co-existent, with the domains of the different block types directed to occupy the same locations in the self-assembled polymer layer by the two respective aligned epitaxy patterns. Typically, the spacing between the spaced graphoepitaxy features may correspond to a multiple of the periodicity (i.e. unit cell pitch) of the self-assembled block copolymer that the graphoepitaxy features are intended to direct during self-assembly, such as, for instance, 8 or more periods, say 10 to 1000 periods.

The chemical epitaxy pattern and the graphoepitaxy pattern of the spaced graphoepitaxy features are both formed by photolithography. By photolithography is meant that one or more chemical resist layers are applied to the surface and by selective exposure to actinic radiation and development and/or etching of the resist layer(s), patterns are formed on the surface for the chemical epitaxy pattern and for the graphoepitaxy pattern of spaced graphoepitaxy features.

The resist layer is typically selectively exposed to actinic radiation to provide exposed and unexposed regions of resist layer. Conventional lithographic patterning methods such as mask or maskless extreme ultraviolet (EUV) or deep ultraviolet (D-UV) radiation lithography may be used to provide a desired high resolution exposure pattern, or a method such as electron beam lithography may be employed. Typical D-UV lithography is at 193 nm. One of the exposed or unexposed resist regions may be removed with a first developer to provide the surface having resist features of the remaining resist region thereon. The developer is chosen to be capable of dissolving or removing one of the exposed or unexposed resist regions while leaving the other region remaining in place on the substrate. Details of how such a photolithography method may be employed in the method are set out in detail hereinbelow.

The template formed by the method is not limited to a linear template; for instance the template may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases, where the different domain types are arranged side-by-side on a surface of a substrate.

In a suitable arrangement, referred to herein as a single resist arrangement, the method may be put into effect by:

applying a resist layer to the surface, selectively exposing the resist layer to actinic radiation by photolithography to provide exposed and unexposed regions of resist layer, removing one of the exposed or unexposed resist regions with a first developer to provide the surface having resist features of the remaining resist region thereon, applying a first orientation layer to the surface having resist features thereon, the first orientation layer deposited onto the surface between the resist features to provide first regions, and removing selected resist features from the surface to leave spaced resist features as the spaced graphoepitaxy features and having between the spaced resist features a chemical epitaxy pattern comprising a pattern of first regions of first orientation layer and a complementary pattern of second regions of surface free from first orientation layer where the selected resist features have been removed.

The actinic radiation may suitably be D-UV or EUV radiation. The selective exposure to actinic radiation may be by patterning of the E-UV or DUV radiation with a lithography apparatus.

Combinations of resist and developer are known in the art for both positive tone development (where exposed resist regions are removed with the developer such that the remaining resist features are of unexposed resist regions), and for negative tone development (where the unexposed resist regions are removed with the developer such that the remaining resist features are of exposed resist regions).

The exposed resist regions may be removed with the first developer such that the resist features are of unexposed resist regions. Alternatively, the unexposed resist regions may be removed with the first developer such that the resist features are of exposed resist regions.

In an embodiment, resist regions exposed to actinic radiation may be removed with the first developer such that the resist features are of unexposed resist regions (i.e. a positive tone resist may be used).

The substrate may have an anti-reflection coating for the actinic radiation at the surface.

The first orientation layer may be suitably arranged to be bonded to the surface and unbonded to the resist features and unbonded first orientation layer is removed from the resist features prior to removal of the selected resist features. Following deposition of the first orientation layer, a process such as heating may be carried out to bond the first orientation layer to the surface, leaving it unbonded to the resist features. Unbonded first orientation layer may be removed from the resist features by application of a vacuum or by rinsing with a suitable solvent such as an organic solvent.

The first orientation layer may be applied by any suitable method such as spin coating or spraying, or suitably, for some orientation layers, the first orientation layer may be applied by vapor deposition.

The first orientation layer may comprise or consist essentially of an organic compound having a reactive head group. This organic compound may have a tail group such as a hydrocarbon (e.g. alkyl or aryl) or polymer moiety having a chemical affinity for the different blocks of the self-assemblable polymer, combined with a reactive head group adapted to bond the organic compound to the surface of the substrate.

For instance, the first orientation layer may comprise a random copolymer (i.e., as tail group) having a head group covalently bondable to the surface, such as an OH group. This random copolymer may suitably be a random block copolymer made up of blocks of the same monomer as the blocks of the self-assemblable block copolymer.

The first orientation layer may comprise an organic compound having a reactive substituted silane head group. An appropriate substituted silane may react with hydroxyl groups on the substrate surface to form a covalent linkage of the organic compound having a reactive substituted silane head group with the surface. The reactive head group may be, but is not limited to, trichlorosilane, trimethoxysilane, triethoxysilane, methyldimethoxysilane, methyldiethoxysilane, methyldichlorosilane, dimethylchlorosilane, dimethylmethoxysilane or dimethylethoxysilane. The tail can be a wide variety of chemical moieties, including linear, branched or cyclic alkyls, aromatic or heterocyclic moieties, ether or ester moieties, polymer chains, and so on.

A mixture of organic compounds having reactive substituted silane head groups may be employed.

The organic compound having a reactive substituted silane head group may be 3-(p-methoxyphenyl)propyltrichlorosilane. This may suitably be applied to the surface of the substrate by vapor deposition. This compound is useful for use as a neutral orientation layer with a cylindrical or lamellar phase poly(styrene-b-methylmethacrylate) block copolymer.

The first orientation layer may be a neutral orientation layer having chemical affinity with both first and second blocks, and wherein the second regions have a higher chemical affinity for the second block than the first block such that the self-assemblable polymer is directed to assemble with domains of the second block located in contact with the second regions.

The first orientation layer may be an orientation layer having higher chemical affinity for the first block than the second block such that the self-assemblable polymer is directed to assemble with domains of the first block located in contact with the first regions of first orientation layer.

After the removing one of the exposed or unexposed resist regions, the resist features may be laterally trimmed prior to application of the first orientation layer such that the dimensions of features of the complementary pattern of second regions of the chemical epitaxy pattern are correspondingly reduced in lateral extent. This may be achieved by a known trimming method using liquid or gas/vapor etching. For instance, isotropic etching of the resist features using gas/vapor etching may be used for trimming.

The chemical epitaxy pattern will typically comprise alternating first and second regions. The chemical epitaxy pattern may have the same periodicity (i.e. unit cell pitch) as the self-assembled block copolymer that it is intended to direct during self-assembly, but more usually, the periodic spacing between adjacent portions of one region will correspond to a plurality of unit cells for the self-assembled polymer. This allows for the effect known as pitch multiplication. So, for instance, using an example of a lamellar self-assembled polymer phase, having domains of width W1 for the first block and width W2 for the second block, the unit cell period or pitch of the self-assembled polymer will be W1+W2. For the chemical epitaxy pattern, if this has the same pitch, then it will consist of alternating stripes of first region having width W1 and second region having width W2, each region arranged for chemical affinity with (or neutrality to) the corresponding polymer blocks.

However, another suitable arrangement may have, for instance, first regions of width W1, having high chemical affinity for one of the first blocks, separated by stripes of second region of width [n·(W2+W1)+W2], where n is an integer of value 1 or more, such as from 1 to 20, or 1 to 10, for instance 1, 2, 3, 4, 5, 6, 7, 8, 9 or 10, the second region having similar chemical affinity (i.e. neutral chemical affinity) for first and second blocks.

In fact, the width of the first regions may be, say from 0.4 W1 to 1.5 W1 (i.e. near to but not exactly W1) provided that the periodicity of the first regions corresponds to n·[W1+W2], where n is an integer as already set out. In other words, it is not essential that the narrowest features of the chemical epitaxy pattern have exactly the same dimension as the corresponding domain of the self-assembled polymer.

In the above example, the roles of the first and second regions may be reversed, with thin stripes (e.g. from 0.4 to 1.5 W2 in width) of region 2 separated by wide stripes [n·(W2+W1)+W1] of first region, with the first region having neutral chemical affinity towards both of the blocks and the second region having chemical affinity for one of the blocks.

A second orientation layer may be applied to the surface prior to applying the resist layer to the surface, the second orientation layer having a chemical affinity differing from that of the first orientation layer such that the complementary pattern of second regions of surface free from first orientation layer where the selected resist features have been removed is of the second orientation layer. For the sake of clarity, this second orientation layer is applied before the application of the first orientation layer, and indeed before the application of the resist layer, in this arrangement.

The second orientation layer may be a primer layer provided on the surface and the resist layer applied onto the primer layer, for instance to improve uniform deposition of the resist onto the surface.

When such a second orientation layer is present, it may be removed from the surface between the resist features prior to application of the first orientation layer. For instance, the residual second orientation layer between resist features may be removed by treatment with oxygen, for instance as a plasma, or by UV generated ozone.

Removal of the selected resist features from the surface to leave spaced resist features may suitably involve selective exposure of the selected resist features to actinic radiation by photolithography while leaving the spaced resist features unexposed, such that the selected resist features are rendered chemically modified, and subsequent removal of the chemically modified selected resist features with a second developer to provide the surface having the spaced resist features as spaced graphoepitaxy features thereon.

In an embodiment, the resist is suitably a resist adapted to be developed using differing developers depending upon the type or dosage of actinic radiation applied to the resist. For instance, a resist is available which, when subjected to a low dose of UV radiation, becomes soluble to an organic solvent as developer, but when subjected to a higher dose of actinic radiation, instead becomes soluble to a base (such as TMAH—tetramethylammonium hydroxide) while being insoluble to organic solvent. Such "polarity switched" resists are useful for this arrangement for putting the method into effect. Hence, the actinic radiation to expose the resist features may be the same as that to expose the resist layer, but of a substantially higher dose such that the characteristics of such a polarity switched resist is different.

Suitably, the spaced resist features remaining on the surface of the substrate as spaced graphoepitaxy features should be resistant to dissolution by the self-assemblable block copolymer or a solvent of or used for the self-assemblable block copolymer layer.

The actinic radiation may suitably be applied to the selected resist features prior to application of the first orientation layer.

Another suitable arrangement for putting the method into effect may use two resist layers (referred to herein as a dual resist arrangement). For this arrangement, a polarity switched resist is not used or needed and a conventional resist may be used, such as a chemically accelerated resist with positive or negative tone development. Such a method may comprise:

applying a first resist layer to the surface;

selectively exposing the first resist layer to actinic radiation by photolithography to provide exposed and unexposed regions of resist layer;

removing one of the exposed or unexposed resist regions with a first developer to provide the surface having resist features of the remaining resist region thereon;

applying a first orientation layer to the surface having resist features thereon, the first orientation layer deposited onto the surface between the resist features to provide first regions;

removing the resist features from the surface to leave a chemical epitaxy pattern comprising a pattern of first regions of first orientation layer, and a complementary pattern of second regions of surface free from first orientation layer;

applying a second resist layer to the surface;

selectively exposing the first resist layer to actinic radiation by photolithography to provide exposed and unexposed regions of resist layer; and removing one of the exposed or unexposed resist regions with a second developer to provide the surface having spaced resist features of the second resist thereon, as the spaced graphoepitaxy features aligned with the chemical epitaxy pattern.

For this dual resist arrangement, as for the single resist arrangement, a second orientation layer may be applied to the substrate prior to the application of the first resist layer. The features as set out for the first and second orientation layers, and for the spacings and configurations of the graphoepitaxy and chemical epitaxy patterns, for the single resist arrangement are also applicable to this dual resist arrangement, where appropriate. Similarly, other suitable features set out in relation to the single resist arrangement, such as the use of trimming of resist features for preparation of the chemical epitaxy pattern, may be applied to the dual resist arrangement where appropriate.

In an embodiment, there is provided a method of forming a self-assembled polymer layer on a surface of a substrate. The surface of the substrate is provided with a patterned neutral orientation layer thereon, by the method set out above.

The self-assemblable polymer layer is deposited directly onto the template on the substrate to provide an interface between the self-assemblable polymer layer and the template. The self-assemblable polymer layer is treated to provide self-assembly into an ordered polymer layer at the interface. Directed self-assembly is achieved as set out hereinbefore, with the combined chemical epitaxy and graphoepitaxy template of the invention used to direct self-assembly.

In an embodiment, there is provided a lithography method for patterning a surface of a substrate by resist etching, using the self-assembled polymer as resist. The method comprises providing an ordered, self-assembled polymer layer at the surface by a method herein, with self-assembly directed by the combined template. The ordered polymer layer is used as a resist layer for patterning the substrate using a method known in the art.

In an embodiment, there is provided a method for forming a device topography at a surface of a substrate, using the self-assembled polymer layer formed by a method herein as a resist layer while etching the substrate to provide the device topography.

BRIEF DESCRIPTION OF THE DRAWINGS

Specific embodiments of the invention will be described with reference to the accompanying figures, in which.

DETAILED DESCRIPTION

Figure 1A:
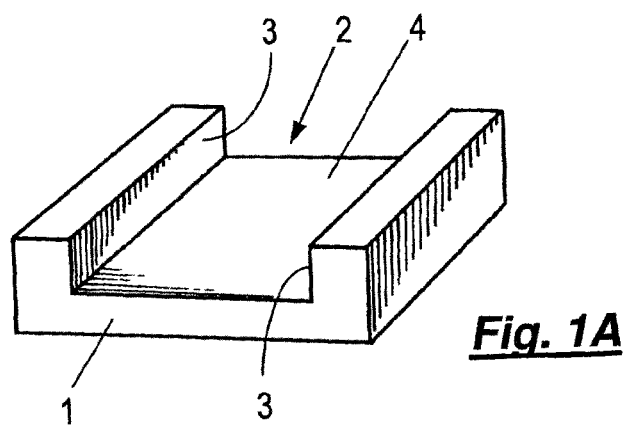
FIGS. 1A to 1C schematically depict directed self-assembly of A-B block copolymer onto a substrate by graphoepitaxy and formation of relief patterns by selective etching of one domain.
Figure 1B:
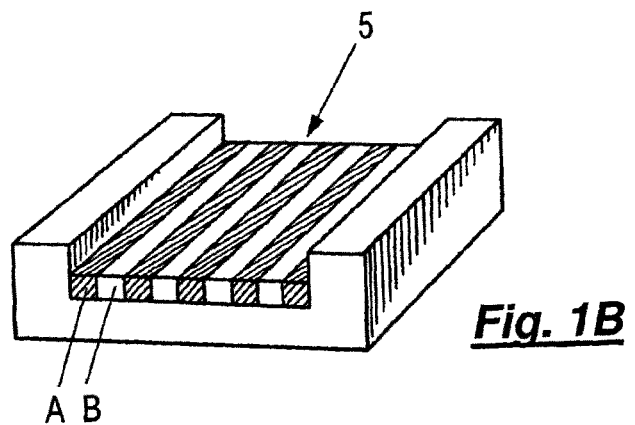
Figure 1C:
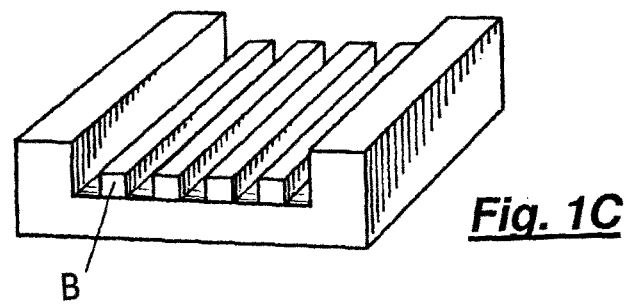

FIG. 1A shows a substrate 1 with a trench 2 formed therein bounded by side walls 3 and a bottom surface 4. In FIG. 1B, a self-assemblable A-B block copolymer with lyophilic (e.g., hydrophilic) A blocks and lyophobic (e.g., hydrophobic) B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the a side wall 3, which is also lyophilic (e.g., hydrophilic). In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
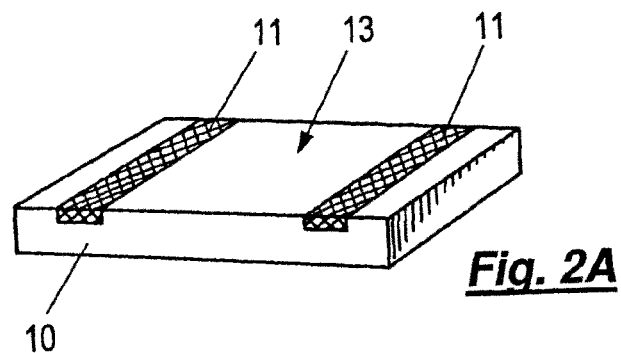
FIGS. 2A to 2C schematically depict directed self-assembly of A-B block copolymer onto a substrate by chemical pre-patterning and formation of relief patterns by selective etching of one domain.
Figure 2B:
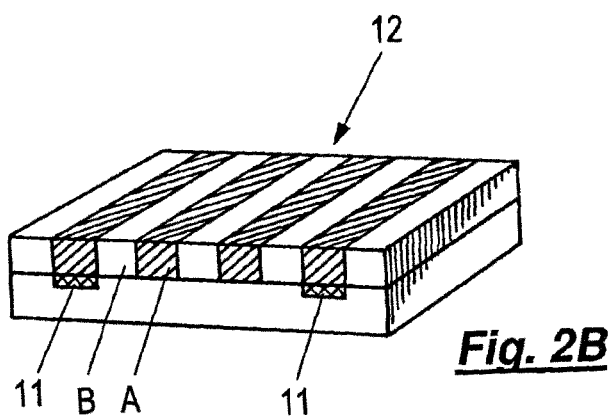
Figure 2C:
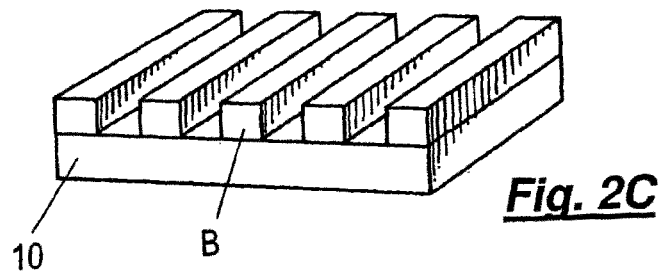

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with lyophilic (e.g., hydrophilic) A blocks and lyophobic (e.g., hydrophobic) B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A domains have nucleated atop the pinning stripes 11, which are also lyophilic (e.g., hydrophilic). In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

In the following, the di-block copolymer used as a self-assemblable polymer is poly(styrene-b-methylmethacrylate) block copolymer.

FIGS. 3A to 3E depict a substrate undergoing a process, according to an embodiment of the invention, involving forming a combined graphoepitaxy and chemical epitaxy template on a surface of the substrate. FIG. 3F depicts assembling a self-assemblable di-block copolymer thereon.

Figure 3A:
FIGS. 3A to 3F schematically depict cross sectional views of a substrate undergoing a process involving forming a combined graphoepitaxy and chemical epitaxy template on a surface of a substrate, and assembling a self-assemblable di-block copolymer thereon, according to a single resist embodiment of the invention, using a first orientation layer.
Figure 3B:
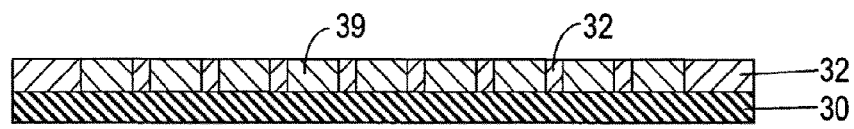
Figure 3C:
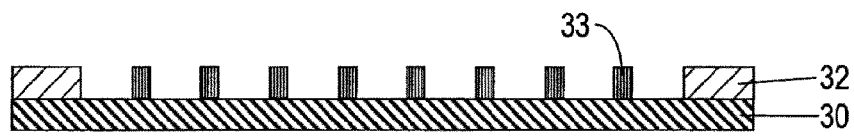

A substrate 30 has a 193 nm (D-UV) polarity switch positive tone resist layer 31 deposited via spin-coating in FIG. 3A. A pattern of exposed regions 39 and unexposed regions 32 is generated into the resist layer by, for example, 193 nm D-UV water immersion lithography (application of first actinic radiation), as shown in FIG. 3B. Through subsequent positive tone development, the exposed resist 39 is removed from the substrate 30 by an organic solvent (such as anisole) as first developer, leaving a topographic pattern of unexposed resist features 32. The substrate, with the remaining resist features thereon, is then exposed to a second patterning using 193 nm D-UV actinic radiation by photolithography to expose selected resist features 33 to a higher dose (second actinic radiation). This is shown in FIG. 3C. However, the selected resist features 33 are not removed at this stage.

Figure 3D:
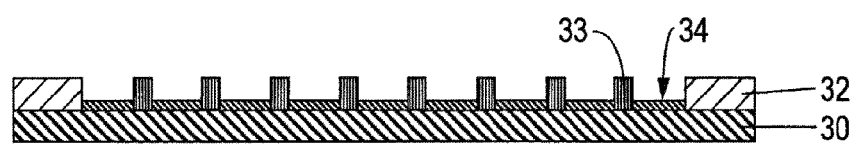

Subsequently a silane compound, with a reactive silane headgroup, such as 3-(p-methoxyphenyl)propyltrichlorosilane, is applied to and reacts to bond with the activated surface via vapor deposition to provide first orientation layer 34. Unreacted silane compound remains unbonded to resist features 32, 33 and is removed by vacuum or by rinsing with organic solvent. FIG. 3D shows the result.

Figure 3E:
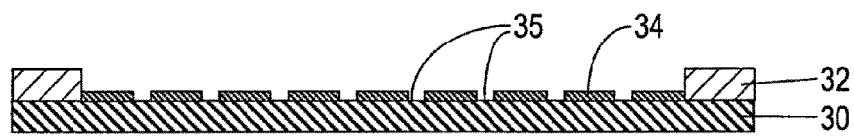
Figure 3F:
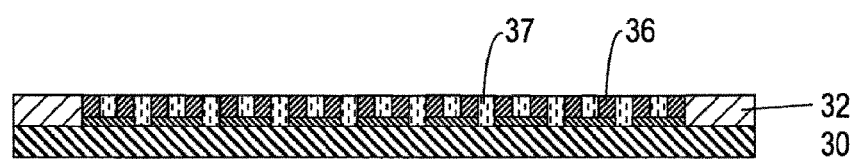

Following deposition of the first orientation layer 34 on the bared surface of substrate 30, the selected resist features 33 are removed using a basic second developer, such as TMAH, to leave spaced unexposed resist features 32, resistant to organic solvent, as spaced graphoepitaxy features. Where the selected resist features 33 have been removed, bare surface is left providing a pattern of second regions 35 complementary to the pattern of first regions of the first orientation layer 34. This is as shown in FIG. 3E.

In an embodiment not shown, the second actinic radiation may suitably be applied to the selected resist features prior after application of the first orientation layer. However, it is desired to follow the method as shown so that the first orientation layer does not have to be subjected to the second actinic radiation, which may chemically affect its behavior in a detrimental manner.

In FIG. 3F, the self-assemblable block copolymer has been applied via spin-coating and subsequently annealed via thermal treatment or solvent annealing to self-assemble into domains 36, 37. In this embodiment, the domains of one type 37 align with the second regions 35 with alternating domains 36, 37 aligned side-by-side on the first regions of first, neutral orientation layer 34 between the spaced resist features 32. In this embodiment, the substrate surface is arranged to have chemical affinity for the domains 37 with the first orientation layer 34 having neutral chemical affinity, so that either of domains 36, 37 may form on first orientation layer 34.

FIGS. 4A to 4G depict a substrate undergoing a process, according to an embodiment of the invention, involving forming a combined graphoepitaxy and chemical epitaxy template on a surface of the substrate. FIG. 4H depicts assembling a self-assemblable di-block copolymer thereon.

A substrate 30 is provided with a second orientation layer 40 of a compound having a high chemical affinity for one of the domains 37 of the self-assemblable di-block copolymer to be applied subsequently. The selective orientation layer 40 has low chemical affinity for the other domain 36.

This second orientation layer 40 may be a brush polymer that can be applied by spin-coating and thermal curing to react and bond terminal hydroxyl groups of the brush polymer with the surface of the substrate 30 to provide bonding. In another arrangement, for instance, the second orientation layer 40 may be a crosslinkable polymer that is applied via spin-coating and that is cured by thermal treatment or by photo-crosslinking. In another arrangement, for instance, this second orientation layer may be a layer, for instance a monolayer of a first silane compound with a reactive silane headgroup, applied via vapor deposition or spin-coating (an appropriate silane would consist of a reactive substituted silane headgroup that can react, for instance, with hydroxyl groups on the substrate surface to form a covalent linkage between the Si of the silane headgroup and the surface and a "tail" that shows preferential interaction with one of the blocks of the self-assemblable polymer).

Figure 4A:
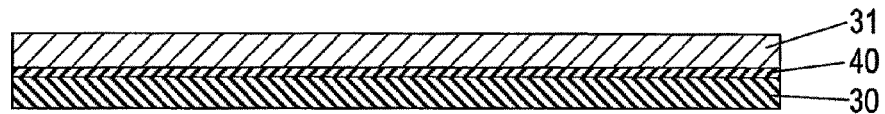
FIGS. 4A to 4H schematically depict cross sectional views of a substrate undergoing a process involving forming a combined graphoepitaxy and chemical epitaxy template on a surface of a substrate, and assembling a self-assemblable di-block copolymer thereon, according to a single resist embodiment of the invention, using first and second orientation layers.
Figure 4B:
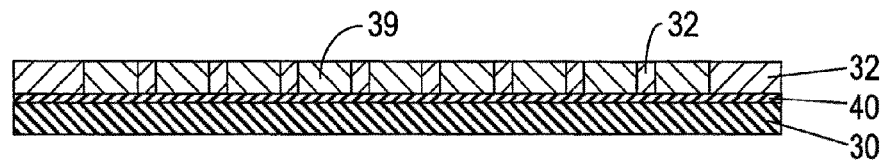
Figure 4C:
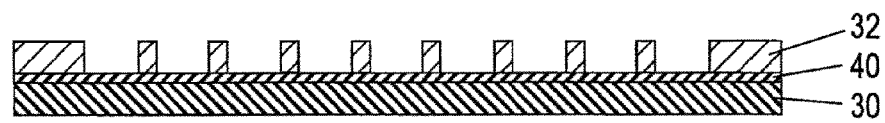

After provision of the second orientation layer 40, a 193 nm (D-UV) polarity switch resist layer 31 is deposited onto the second orientation layer 40 for instance by spin-coating (FIG. 4A). A pattern of exposed 39 and unexposed 32 regions is generated in the resist layer by, for example, 193 nm water immersion lithography (FIG. 4B). By subsequent positive tone development of the resist layer, the exposed resist 39 is removed from the substrate 30, leaving a pattern of resist features of unexposed resist 32 as shown in FIG. 4C. In this manner, the underlying second orientation layer 40, which will eventually remain as part of the chemical epitaxy template, is not exposed to the 193 nm D-UV radiation, thereby not risking actinic modification of a chemical property of the second orientation layer 40.

The remaining resist features 32 may be trimmed to reduce their lateral extent to obtain trimmed resist features having a desired dimension for pinning regions of the selective orientation layer for a chemical epitaxy template. This trimming allows the formation of complementary pattern features of dimensions smaller than those attainable solely by D-UV lithography. This trimming is not shown in the Figures and is optional.

Figure 4D:
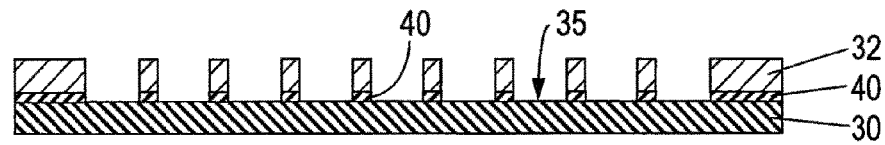

The bared regions of second orientation layer 40 are subsequently removed in the uncovered areas by etching with an appropriate etch composition, and the exposed substrate surface 35 activated by a mild oxygen plasma treatment (FIG. 4D).

Figure 4E:
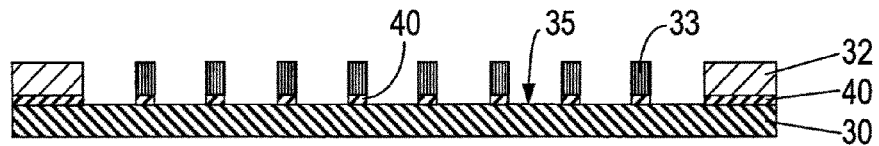

Selected resist features 33 are then subjected to a second actinic radiation in the form of, for example, a higher dose of 193 nm D-UV radiation sufficient to make the selected resist features 33 soluble to a second developer of TMAH. Spaced resist features 32 remain unexposed (FIG. 4E).

Figure 4F:
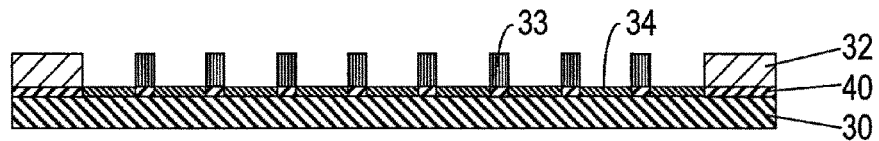

Subsequently, as shown in FIG. 4F, a first orientation layer 34 is applied and reacts to bond with the activated surface 35, in this example by vapor deposition of a second reactive silane compound (although another neutral orientation layer may be employed to bond as set out hereinbefore). An appropriate reactive silane compound comprises a "reactive headgroup" that can react with hydroxyl groups on the substrate surface to form a covalent linkage of the silane with the surface and a "tail", that is neutral to, i.e. has a similar chemical affinity with, both blocks of the di-block copolymer, so that domains of each block type can be ordered in a side-by-side manner on the resulting neutral first orientation layer 34.

Figure 4G:
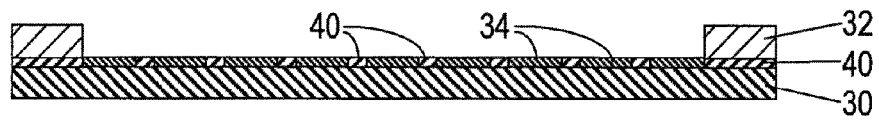
Figure 4H:
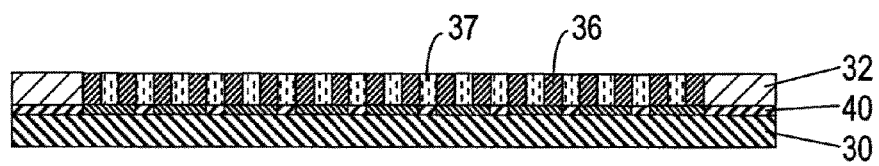

The selected resist features 33 (along with any unbonded second reactive silane compound which does not bond to the resist features) are subsequently removed by development using the second developer, resulting in the desired chemical epitaxy template with alternating regions of first regions of first orientation layer 34 and a complementary pattern of second regions of second orientation layer 40. The unexposed, spaced resist features 32 remain in place as spaced graphoepitaxy features. The result is shown in FIG. 4G.

Finally, a self-assemblable block copolymer layer is applied via spin-coating, as shown in FIG. 4H, and subsequently annealed via thermal treatment or solvent annealing so that the domains 37 align desirably over the complementary pattern of second regions of second orientation layer 40, with alternating domains 36, 37 overlying the pattern of first regions of first neutral orientation layer 34. The graphoepitaxy template formed by the spaced remaining resist features 32 provides chemical affinity between the side walls of the resist features 32 and the domain 36 to further assist direction of self-assembly.

An advantage of this arrangement, as shown in FIGS. 4A to 4H, is that the second lithography step—exposure of selected resist regions 33 to second actinic radiation—does not require high accuracy overlay in order that the selected resist regions 33 are exposed. This is because the gap between the selected resist regions 33 and the remaining unexposed resist features 32 may be quite large where the pitch multiplication is used for the chemical epitaxy pattern, as shown. This may allow the process to be effected in a rapid manner without need for accurate alignment of the substrate 30 within a lithography apparatus.

In FIGS. 5A to 5I, a dual resist embodiment of the invention is depicted involving forming a combined graphoepitaxy and chemical epitaxy template on a surface of the substrate using a dual resist arrangement as described herein.

A substrate 30 is provided with a second orientation layer 40 of a compound having a high chemical affinity for one of the domains 37 of the self-assemblable di-block copolymer to be applied subsequently. The selective orientation layer 40 has low chemical affinity for the other domain 36. The second orientation layer 40 may be as set out in the embodiment of FIGS. 4A to 4H.

Figure 5A:
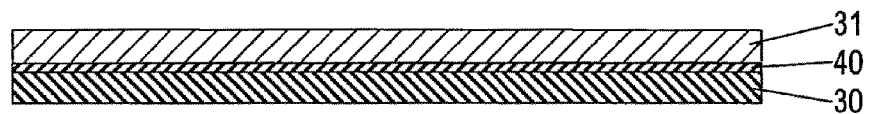
FIGS. 5A to 5I schematically depict cross sectional views of a substrate undergoing a process involving forming a combined graphoepitaxy and chemical epitaxy template on a surface of a substrate using a dual resist arrangement.
Figure 5B:
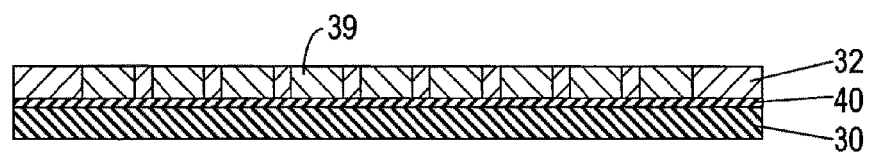
Figure 5C:
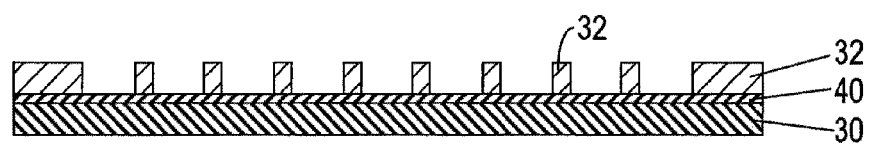

After provision of the second orientation layer 40, a 193 nm (D-UV) positive tone resist layer 31 is deposited onto the second orientation layer 40 for instance by spin-coating. A pattern of exposed 39 and unexposed 32 regions is generated in the resist layer by, for example, 193 nm water immersion lithography (FIG. 5B). By subsequent positive tone development of the resist layer, the exposed resist 39 is removed from the substrate 30 leaving a pattern of resist features of unexposed resist 32 (FIG. 5C). In this manner, the underlying second orientation layer 40, which will eventually remain as part of the chemical epitaxy template, is not exposed to the 193 nm D-UV radiation, thereby not risking actinic modification of a chemical property of second orientation layer 40.

The remaining resist features 32 may be trimmed to reduce their lateral extent to obtain trimmed resist features having a desired dimension for pinning regions of the selective orientation layer for a chemical epitaxy template. This trimming allows the formation of complementary pattern features of a dimension smaller than those attainable solely by D-UV lithography. This trimming is not shown in the Figures and is optional.

Figure 5D:
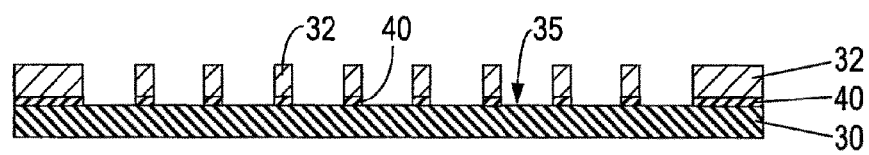

The bared regions of second orientation layer 40 are subsequently removed in the uncovered areas by etching with an appropriate etch composition, and the exposed substrate surface 35 activated by a mild oxygen plasma treatment (FIG. 5D).

Figure 5E:
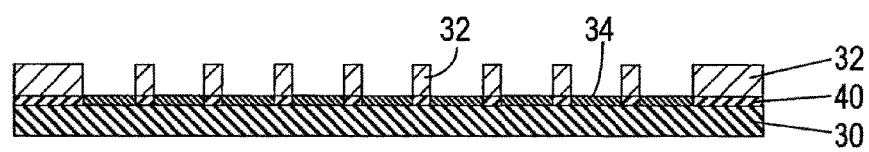

Subsequently, a first orientation layer 34 is applied and reacts to bond with the activated surface 35, in this example by via vapor deposition of a second reactive silane compound (although another neutral orientation layer may be employed to bond as set out herein). This result is shown in FIG. 5E. An appropriate reactive silane compound comprises a "reactive headgroup" that can react with hydroxyl groups on the substrate surface to form a covalent linkage of the silane with the surface and a "tail", that is neutral to, i.e. has a similar chemical affinity with, both blocks of the di-block copolymer, so that domains of each block type can be ordered in a side-by-side manner on the resulting neutral first orientation layer 34.

Figure 5F:
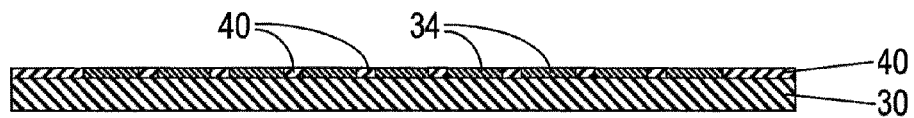

The remaining resist features 32 (along with any unbonded second reactive silane compound which does not bond to the resist features) are subsequently removed by development using the first developer, resulting in the desired chemical epitaxy template with alternating regions of first regions of first orientation layer 34 and a complementary pattern of second regions of second orientation layer 40. This is shown in FIG. 5F.

Figure 5G:
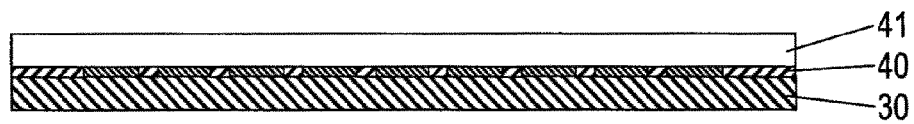
Figure 5H:
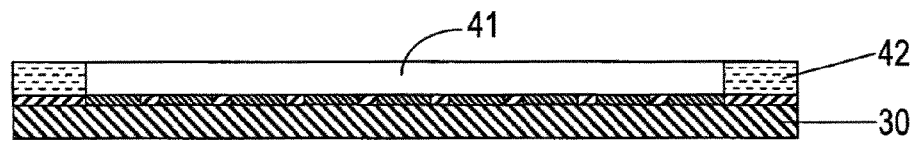
Figure 5I:
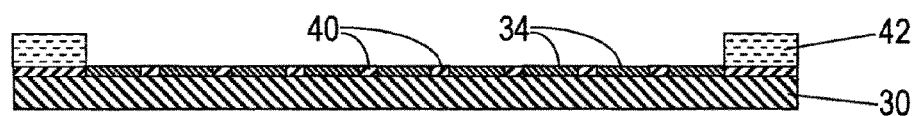

As shown in FIG. 5G, a further resist layer 41, in this case a negative tone resist, is deposited onto the substrate 30 over the chemical epitaxy pattern 34, 40 for instance by spin-coating. A pattern of exposed 42 and unexposed 41 regions is generated in the resist layer 41 by, for example, 193 nm water immersion lithography (FIG. 5H). By subsequent negative tone development of the resist layer 41, the unexposed resist 41 is removed leaving a pattern of spaced resist features of exposed resist 42 (FIG. 5I). The remaining features of exposed resist 42 act as the graphoepitaxy template, aligned with the chemical epitaxy template 34, 40.

The use of a negative tone resist for resist feature formation in this arrangement provides spaced resist features that may be more resistant to a solvent such as those used for a self-assemblable block copolymer. A positive tone resist is generally not crosslinked and so residual features may have a greater tendency to either dissolve or flow in the presence of a solvent.

The described and illustrated embodiments are to be considered as illustrative and not restrictive in character, it being understood that only preferred embodiments have been shown and/or described and that all changes and modifications that come within the scope of the inventions as defined in the claims are desired to be protected. For instance, any suitable molecule or deposition method may be used for the application of the neutral orientation layer. For instance, EUV lithography may be used, employing one or more suitable resist layers, rather than D-UV lithography as mentioned in the embodiments set out herein.

An embodiment of the invention allows for formation onto a substrate of a chemical pre-pattern template or graphoepitaxy template without any particular limitations on the combinations of substrate and self-assemblable polymer to be aligned using the template. Furthermore, the method does not necessarily require complex and/or undesirable process steps such as thermal reflow or lift-off etch processes for removal of residual resist.

An embodiment of the present invention relates to a lithography method. The method may be used in a process for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is of use to create regular nanostructures on a surface for use in the fabrication of integrated circuits, bit-patterned media and/or discrete track media for magnetic storage devices (e.g. for hard drives).

In particular, an embodiment of the invention is of use for high resolution lithography, where features patterned onto a substrate have a feature width or critical dimension of about 1 µm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. A lithographic apparatus therefore usually includes an alignment apparatus, which may be used to align each pattern with a previously provided pattern, and/or with alignment marks provided on the substrate.

In this specification, the term "substrate" is meant to include any surface layers forming part of the substrate, or being provided on a substrate, such as other planarization layers or anti-reflection coating layers which may be at, or form, the surface of the substrate.

The invention claimed is:

1. A method of forming a template for directed self-assembly of a self-assemblable block polymer comprising first and second blocks on a surface of a substrate, the method comprising:

providing a chemical epitaxy pattern on the surface by photolithography, the chemical epitaxy pattern comprising alternating first and second regions having differing chemical affinities for the first and second blocks; and providing spaced graphoepitaxy features on the surface by photolithography, the chemical epitaxy pattern aligned with and located between pairs of spaced graphoepitaxy features, wherein the spaced graphoepitaxy features and chemical epitaxy pattern are arranged to act together to direct self-assembly of the self-assemblable block copolymer.

2. The method of claim 1, comprising selectively exposing a resist layer on the surface to actinic radiation by photolithography to provide exposed and unexposed regions of resist layer;

removing one of the exposed or unexposed resist regions to provide the surface having resist features of the remaining resist region thereon;

applying a first orientation layer to the surface having resist features thereon, the first orientation layer deposited onto the surface between the resist features to provide first regions; and removing selected resist features from the surface to leave spaced resist features as the spaced graphoepitaxy features and having between the spaced resist features a chemical epitaxy pattern comprising a pattern of first regions of first orientation layer and a complementary pattern of second regions of surface free from first orientation layer where the selected resist features have been removed.

3. The method of claim 2, wherein the first orientation layer is arranged to be bonded to the surface and unbonded to the resist features and unbonded first orientation layer is removed from the resist features prior to removal of the selected resist features.

4. The method of claim 2, wherein the exposed resist regions are removed such that the resist features are of unexposed resist regions.

5. The method of claim 2, wherein the first orientation layer comprises a random copolymer having a head group covalently bondable to the surface.

6. The method of claim 2, wherein the first orientation layer is applied by vapor deposition.

7. The method of claim 6, wherein the first orientation layer comprises an organic compound having a reactive substituted silane head group.

8. The method of claim 7, wherein the organic compound having a reactive substituted silane head group is 3-(p-methoxyphenyl)propyltrichlorosilane.

9. The method of claim 2, wherein the first orientation layer is a neutral orientation layer having chemical affinity with both first and second blocks, and wherein the second regions have a higher chemical affinity for the second block than the first block such that the self-assemblable polymer is directed to assemble with domains of the second block located in contact with the second regions.

10. The method of claim 2, wherein the first orientation layer is an orientation layer having higher chemical affinity for the first block than the second block such that the self-assemblable polymer is directed to assemble with domains of the first block located in contact with the first regions of first orientation layer.

11. The method of claim 2, wherein a second orientation layer is provided between the substrate and the resist layer, the second orientation layer having a chemical affinity differing from that of the first orientation layer, and wherein the complementary pattern of second regions of surface free from first orientation layer where the selected resist features have been removed is of the second orientation layer.

12. The method of claim 11, wherein the second orientation layer is removed from the surface between the resist features prior to application of the first orientation layer.

13. The method of claim 2, wherein removal of the selected resist features involves selective exposure of the selected resist features to actinic radiation by photolithography, while leaving the spaced resist features unexposed, such that the selected resist features are rendered chemically modified, and subsequent removal of the chemically modified selected resist features to provide the surface having the spaced resist features as spaced graphoepitaxy features thereon.

14. The method of claim 13, wherein the actinic radiation is applied to the selected resist features prior to application of the first orientation layer.

15. The method of claim 1, comprising:
applying a first resist layer to the surface;
selectively exposing the first resist layer to actinic radiation by photolithography to provide exposed and unexposed regions of resist layer;
removing one of the exposed or unexposed resist regions to provide the surface having resist features of the remaining resist region thereon;
applying a first orientation layer to the surface having resist features thereon, the first orientation layer deposited onto the surface between the resist features to provide first regions;
removing the resist features from the surface to leave a chemical epitaxy pattern comprising a pattern of first regions of first orientation layer, and a complementary pattern of second regions of surface free from first orientation layer;
applying a second resist layer to the surface;
selectively exposing the first resist layer to actinic radiation by photolithography to provide exposed and unexposed regions of resist layer; and
removing one of the exposed or unexposed resist regions to provide the surface having spaced resist features of the second resist thereon, as the spaced graphoepitaxy features aligned with the chemical epitaxy pattern.

16. A method of forming a self-assembled layer of a self-assemblable block copolymer on a surface of a substrate, the method comprising:
providing a template for directed self-assembly of the self-assemblable block copolymer on the substrate by the method of claim 1;
depositing the self-assemblable polymer layer directly onto the template to provide an interface between the self-assemblable polymer layer and the template; and
treating the self-assemblable polymer layer to provide self-assembly into an ordered polymer layer at the interface, directed by the template.

17. A lithography method for patterning a surface of a substrate by resist etching, wherein the method comprises providing an ordered self-assembled polymer layer at the surface by the method of claim 16, wherein the ordered self-assembled polymer layer is used as a resist layer.

18. A method for forming a device topography at a surface of a substrate, the method comprising using a self-assembled polymer layer, formed by the method of claim 16, as a resist layer while etching the substrate to provide the device topography.

* * * * *